US008480991B2

(12) United States Patent
Nichol et al.

(10) Patent No.: US 8,480,991 B2
(45) Date of Patent: *Jul. 9, 2013

(54) USE OF ACID WASHING TO PROVIDE PURIFIED SILICON CRYSTALS

(75) Inventors: Scott Nichol, Toronto (CA); Jian J. Chen, Mississauga (CA)

(73) Assignee: Silicor Materials Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/670,263

(22) PCT Filed: Jul. 23, 2008

(86) PCT No.: PCT/CA2008/001345
§ 371 (c)(1),
(2), (4) Date: Sep. 10, 2010

(87) PCT Pub. No.: WO2009/012583
PCT Pub. Date: Jan. 29, 2009

(65) Prior Publication Data
US 2010/0329959 A1 Dec. 30, 2010

Related U.S. Application Data

(60) Provisional application No. 60/951,374, filed on Jul. 23, 2007, provisional application No. 60/952,732, filed on Jul. 30, 2007.

(51) Int. Cl.
*C01B 33/02* (2006.01)

(52) U.S. Cl.
USPC .......................................... 423/348

(58) Field of Classification Search
USPC .................................. 423/348–350
See application file for complete search history.

(56) References Cited

U.S. PATENT DOCUMENTS

| 4,094,731 A | * | 6/1978 | Keyser et al. ............... 23/295 R |
| 4,097,584 A | * | 6/1978 | Reuschel et al. ............... 423/348 |
| 4,193,974 A | * | 3/1980 | Kotval et al. ................... 423/348 |
| 4,256,717 A | | 3/1981 | Dawless |
| 4,304,763 A | | 12/1981 | Dietl et al. |
| 4,312,847 A | * | 1/1982 | Dawless ........................ 423/348 |

(Continued)

FOREIGN PATENT DOCUMENTS

| JP | 56022620 A | 3/1981 |
| WO | WO-02/16265 A1 | 2/2002 |
| WO | WO-2007/112592 A1 | 10/2007 |

OTHER PUBLICATIONS

Bathey et al., "Review Solar-grade silicon" Journal of Materials Scence 17 (1982) 3077-3096.*

(Continued)

*Primary Examiner* — Anthony J Zimmer
(74) *Attorney, Agent, or Firm* — Schwegman Lundberg & Woessner, P.A.

(57) ABSTRACT

A method for purifying silicon wherein silicon is crystallized from a solvent metal. The method comprises the steps of providing a molten liquid containing silicon, a solvent metal and impurities, cooling the molten liquid to form first silicon crystals and a first mother liquor, separating the first silicon crystals from the first mother liquor, contacting the first silicon crystals with compound which will dissolve the first mother liquor and separating the washed crystals from the wash solution.

19 Claims, 4 Drawing Sheets

U.S. PATENT DOCUMENTS

| | | | |
|---|---|---|---|
| 4,312,849 A | | 1/1982 | Kramer |
| 4,312,850 A * | | 1/1982 | Dietl et al. .................... 423/350 |
| 4,612,179 A * | | 9/1986 | Sanjurjo et al. ............... 423/348 |
| 4,822,585 A * | | 4/1989 | Dawless ........................ 423/348 |
| 4,900,532 A | | 2/1990 | Kurz et al. |
| 7,682,585 B2 * | | 3/2010 | Lynch et al. .................. 423/348 |
| 7,780,938 B2 * | | 8/2010 | Kutsovsky et al. ............ 423/350 |
| 2005/0139148 A1 | | 6/2005 | Fujiwara et al. |
| 2012/0255485 A1 | | 10/2012 | Nichol |

OTHER PUBLICATIONS

"Application Serial No. 200880108159.8, Office Action mailed Nov. 24, 2011", 6 pgs.

"Canadian Application Serial No. 2,694,806, Office Action mailed Oct. 11, 2011", 3 pgs.

"U.S. Appl. No. 13/017,786, Notice of Allowance mailed Mar. 16, 2012", 8 pgs.

"U.S. Appl. No. 13/017,786, Preliminary Amendment filed Feb. 28, 2011", 4 pgs.

"U.S. Appl. No. 13/017,786, Response filed Jan. 27, 2012 to Non Final Office Action mailed Nov. 22, 2011", 7 pgs.

"Chinese Application Serial No. 200880108159.8, Response filed Jun. 11, 2012 to Office Action mailed Dec. 24, 2011", 14 pgs.

"Korean Application Serial No. 10-2010-7003366, Office Action mailed Apr. 30, 2012", 4 pgs.

"International Application Serial No. PCT/CA2008/001345, International Search Report and Written Opinion mailed Oct. 17, 2008", 14 pgs.

"U.S. Appl. No. 13/017,786, Non Final Office Action mailed Oct. 10, 2012", 6 pgs.

"Chinese Application Serial No. 200880108159.8, Office Action mailed Sep. 19, 2012", 18 pgs.

"Japanese Application Serial No. 2010-517239, Office Action Mailed Sep. 27, 2012", English & Japanese Language, 10 Pgs.

"Korean Application Serial No. 10-2010-7003366, Response filed Jul. 30, 2012 to Office Action mailed Apr. 30, 2012", 3 pgs.

* cited by examiner

US 8,480,991 B2

USE OF ACID WASHING TO PROVIDE PURIFIED SILICON CRYSTALS

PRIORITY OF INVENTION

This patent application is a U.S. National Stage Filing under 35 U.S.C. 371 from International Patent Application Serial No. PCT/CA2008/001345, filed Jul. 23, 2008 and published on Jan. 29, 2009 as WO 2009/012583 A1, which claims the benefit of priority to U.S. Provisional Patent Applications Ser. No. 60/951,374, filed Jul. 23, 2007 and Ser. No. 60/952,732, filed Jul. 30, 2007, the contents of which are herein incorporated by reference in their entirety.

BACKGROUND OF THE INVENTION

Many different methods and apparatus have been described for reducing the amount of impurities in silicon, including, e.g., zone melting, silane gas distillation, gas injection, acid leaching, slagging and directional solidification. However boron, phosphorous, titanium, iron and some other elements can only be eliminated with currently known processes to the required purity with great difficulty and/or expensive processing steps.

Currently silicon is typically purified by a process that involves reduction and/or thermal decomposition of an exceptionally pure vaporizable compound of silicon such as trichlorosilane. This process is very costly and capital-intensive way of producing silicon that has a higher purity than is required for some application such as solar cells.

SUMMARY OF THE INVENTION

The present invention provides for methods of purifying silicon, and methods for obtaining relatively purified silicon. The methods described herein can effectively provide commercial quantities (e.g., at least about 240 kg) of purified silicon, in a relatively cost-effective manner. The methods described herein can effectively provide at least about 100 tons/year of purified silicon, in a relatively cost-effective manner. Additionally, the methods described herein can be carried out in about 24 to about 94 hours, typically within about 72 hours. The relatively purified silicon crystals obtained by the methods described herein can subsequently be further purified, to provide solar grade silicon.

The present invention provides a method for purifying silicon, the method includes: (a) forming a first molten liquid from silicon and a solvent metal selected from the group of copper, tin, zinc, antimony, silver, bismuth, aluminum, cadmium, gallium, indium, magnesium, lead, an alloy thereof, and combinations thereof; (b) contacting the first molten liquid with a first gas, to provide dross and a second molten liquid; (c) separating the dross and the second molten liquid; (d) cooling the second molten liquid to form first silicon crystals and a first mother liquid; (e) separating the first silicon crystals and the first mother liquid; (f) contacting the first silicon crystals with an acid, base, alcohol or chemical capable of dissolving the solvent metal, to provide washed silicon crystals and used acid; and (g) separating the washed silicon crystals and the used acid.

The present invention also relates to a method for purifying silicon. The method includes (a) forming a first molten liquid from silicon and aluminum; (b) contacting the first molten liquid with a first gas, to provide dross and a second molten liquid; (c) separating the dross and the second molten liquid; (d) cooling the second molten liquid to form first silicon crystals and a first mother liquor; (e) separating the first silicon crystals and the first mother liquor; (f) melting the first silicon crystals with a solvent metal and repeating steps (a)-(e); (g) contacting the first silicon crystals with an acid, base, alcohol or chemical capable of dissolving the solvent metal, to provide washed silicon crystals and used acid; and (h) separating the washed silicon crystals and the used acid, sufficient to provide purified silicon crystals; (i) melting the purified silicon crystals, sufficient to provide a silicon melt; (j) contacting the silicon melt with a second gas; and (k) directionally solidifying the silicon melt.

BRIEF DESCRIPTION OF THE DRAWINGS

Embodiments of the invention may be best understood by referring to the following description and accompanying drawings which illustrate such embodiments. The numbering scheme for the Figures included herein are such that the leading number for a given reference number in a Figure is associated with the number of the Figure. Reference numbers are the same for those elements that are the same across different Figures. In the drawings.

DETAILED DESCRIPTION OF THE INVENTION

Figure 1:
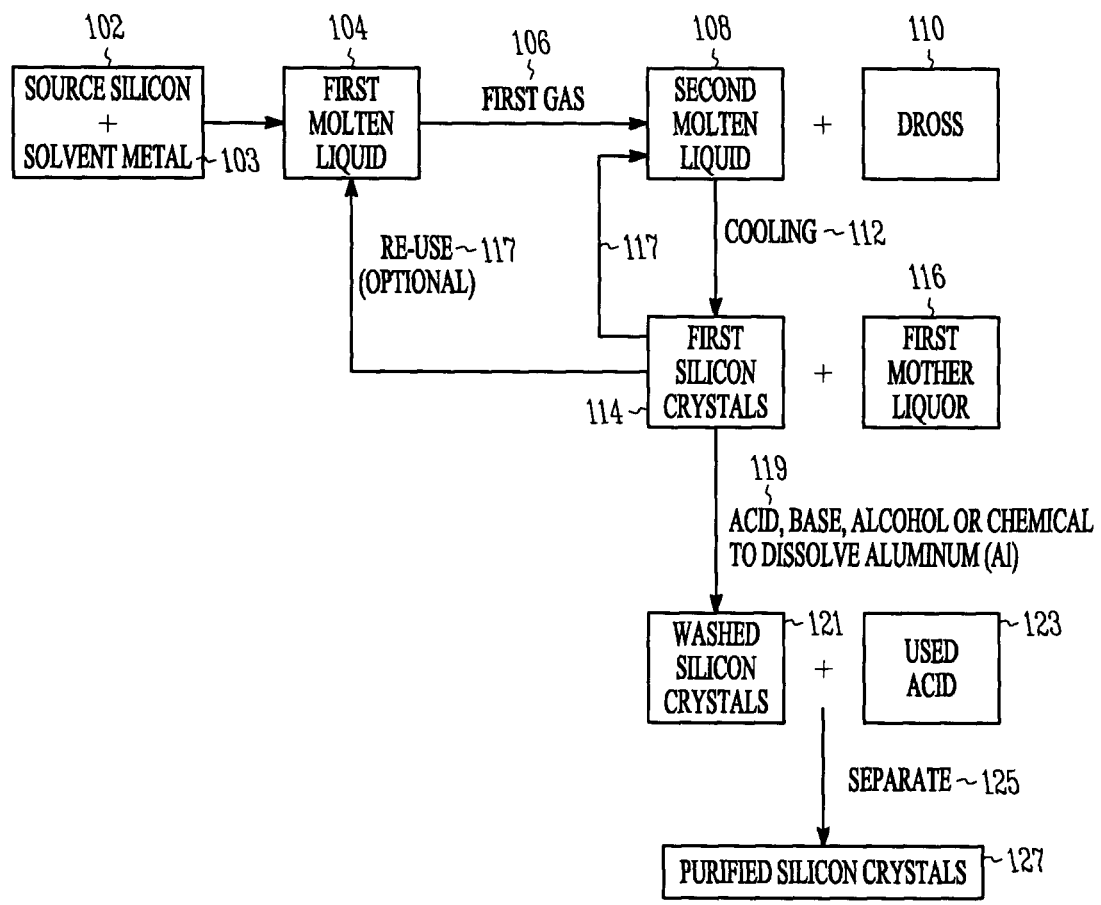
FIG. 1 illustrates a block flow diagram for methods of purifying silicon including contacting with a gas, methods for obtaining purified silicon, as well as methods for obtaining purified silicon crystals, purified granulized silicon, silicon chunks and/or purified silicon ingots.

Reference will now be made in detail to certain claims of the invention, examples of which are illustrated in the accompanying structures and formulas. While the invention will be described in conjunction with the enumerated claims, it will be understood that they are not intended to limit the invention to those claims. On the contrary, the invention is intended to cover all alternatives, modifications, and equivalents, which may be included within the scope of the present invention as defined by the claims.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present invention relates to methods of purifying silicon, and methods for obtaining purified silicon. When describing the methods of purifying silicon, and methods for obtaining purified silicon, the following terms have the following meanings, unless otherwise indicated.

Definitions

Unless stated otherwise, the following terms and phrases as used herein are intended to have the following meanings:

In the methods of manufacturing described herein, the steps can be carried out in any order without departing from the principles of the invention, except when a temporal or operational sequence is explicitly recited. Recitation in a claim to the effect that first a step is performed, then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E, and that the sequence still falls within the literal scope of the claimed process.

Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

As used herein, "multiple" refers to two or more, e.g., 2, 3, 4 or 5.

As used herein, "purifying" refers to the physical separation of a chemical substance of interest from foreign or contaminating substances.

As used herein, "contacting" refers to the act of touching, making contact, or of immediate proximity.

As used herein, "crystallizing" includes the process of forming crystals (crystalline material) of a substance, from solution. The process separates a product from a liquid feedstream, often in extremely pure form, by cooling the feedstream or adding precipitants which lower the solubility of the desired product so that it forms crystals. The pure solid crystals are then separated from the remaining liquor by filtration or centrifugation.

As used herein, "crystalline" includes the regular, geometric arrangement of atoms in a solid.

As used herein, "decanting" or "decantation" includes pouring off a fluid, leaving a sediment or precipitate, thereby separating the fluid from the sediment or precipitate.

As used herein, "filtering" or "filtration" refers to a mechanical method to separate solids from liquids by passing the feed stream through a porous sheet such as a ceramic or metal membrane, which retains the solids and allows the liquid to pass through. This can be accomplished by gravity with the use of, e.g., a strainer, or by pressure or vacuum (suction). The filtering effectively separates the sediment or precipitate from the liquid.

As used herein, "separating" refers to the process of removing a substance from another (e.g., removing a solid or a liquid from a mixture). The process can employ any technique known to those of skill in the art, e.g., decanting the mixture, skimming one or more liquids from the mixture, centrifuging the mixture, filtering the solids from the mixture, or a combination thereof.

As used herein, "filtering" refers to the process of removing solids from a mixture by passing the liquid through a filter, thereby suspending the solids on the filter.

As used herein, "decanting" refers to the process of pouring off a liquid without disturbing the sediment, or the process of pouring off a liquid with a minimal disturbance of the sediment.

As used herein, "centrifuging" refers to process that involves the use of the centripetal force for the separation of mixtures, e.g., solids from a mixture. Centrifuging increases the effective gravitational force on a container so as to more rapidly and completely cause the precipitate to gather on the sides or bottom of the vessel. The solution ("supernatant") can then be quickly decanted from the vessel without disturbing the precipitate. The rate of centrifugation is specified by the acceleration applied to the sample, typically measured in revolutions per minute (RPM). The particle's settling velocity in centrifugation is a function of the particle's size and shape, centrifugal acceleration, the volume fraction of solids present, the density difference between the particle and the liquid, and the viscosity.

As used herein, "skimming" refers to the process of removing one or more liquids, solids of combination there of from a mixture, wherein the one or more liquids are floating on top of the mixture.

As used herein, "agitating" refers to the process of putting a mixture into motion with a turbulent force. Suitable methods of agitating include, e.g., stirring, mixing, and shaking.

As used herein, "precipitating" refers to the process of causing a solid substance (e.g., crystals) to be separated from a solution. The precipitating can include, e.g., crystallizing.

As used herein, "mother liquor" refers to the solid or liquid obtained after solids (e.g., crystals) are removed from a mixture of a solution of solids in a liquid. As such, the mother liquor will not include an appreciable amount of these solids.

As used herein, "silicon" refers to the chemical element that has the symbol Si and atomic number 14.

As used herein, "source silicon" refers to a mixture or compound containing an amount of silicon to be purified. The source silicon may or may not be metallurgical grade.

As used herein, "metallurgical grade silicon" refers to relatively pure (e.g., at least about 95.0 wt. %) silicon.

As used herein, "molten" refers to a substance that is melted, wherein melting is the process of heating a solid substance to a point (called the melting point) where it turns into a liquid.

As used herein, "solvent metal" refers to one or more metals, or an alloy thereof, which upon heating, can effectively dissolve silicon, resulting in a molten liquid. Suitable exemplary solvent metals include, e.g., copper, tin, zinc, antimony, silver, bismuth, aluminum, cadmium, gallium, indium, magnesium, lead, an alloy thereof, and combinations thereof.

As used herein, an "alloy" refers to a homogeneous mixture of two or more elements, at least one of which is a metal, and where the resulting material has metallic properties. The resulting metallic substance usually has different properties (sometimes significantly different) from those of its components.

As used herein, "liquidus" refers to a line on a phase diagram above which a given substance is stable in the liquid phase. Most commonly, this line represents a transition temperature. The liquidus may be a straight line, or it may be curved, depending upon the substance. The liquidus is most often applied to binary systems such as solid solutions, including metal alloys. The liquidus may be contrasted to the solidus. The liquidus and solidus do not necessarily align or overlap; if a gap exists between the liquidus and solidus, then within that gap, the substance is not stable as either a liquid or a solid.

As used herein, "solidus" refers to a line on a phase diagram below which a given substance is stable in the solid phase. Most commonly, this line represents a transition temperature. The solidus may be a straight line, or it may be curved, depending upon the substance. The solidus is most often applied to binary systems such as solid solutions, including metal alloys. The solidus may be contrasted to the liquidus. The solidus and liquidus do not necessarily align or overlap. If a gap exists between the solidus and liquidus, then within that gap, the substance is not stable as either a solid or a liquid; such is the case, for example, with the olivine (fosterite-fayalite) system.

As used herein "evolve" or "evolve a gas" refers to the process in which a liquid or solid will undergo a chemical reaction or decomposition to release a gas under certain conditions (typically high temperature).

As used herein, "dross" refers to a mass of solid impurities floating on a molten metal bath. It appears usually on the melting of low melting point metals or alloys such as tin, lead, zinc or aluminum, or by oxidation of the metal(s). It can be removed, e.g., by skimming it off the surface. With some metals, salt fluxes can be added to separate the dross. Dross is distinguished from slag, which is a (viscous) liquid floating on the alloy, by being solid.

As used herein, "slag" refers to by-product of smelting ore to purify metals. They can be considered to be a mixture of metal oxides; however, they can contain metal sulphides and metal atoms in the elemental form. Slags are generally used as a waste removal mechanism in metal smelting. In nature, the ores of metals such as iron, copper, lead, aluminum, and other metals are found in impure states, often oxidized and mixed in with silicates of other metals. During smelting, when the ore is exposed to high temperatures, these impurities are separated from the molten metal and can be removed. The collection of compounds that is removed is the slag.

As used herein, "inert gas" refers to any gas, or combination of gases, that is not reactive under normal circumstances. Unlike the noble gases, an inert gas is not necessarily elemental and are often molecular gases. Like the noble gases, the tendency for non-reactivity is due to the valence, the outermost electron shell, being complete in all the inert gases. Exemplary inert gases include, e.g., helium (He), Neon (Ne), Argon (Ar) and nitrogen ($N_2$).

As used herein, "rotary degasser" refers to an apparatus for removing impurities from molten metal that includes a degasser shaft, an impeller block and a coupling. The shaft is preferably hollow to allow for the passage of gas therethrough. The impeller block is connected to the degasser shaft, is typically formed of heat resistant material and has at least one metal-transfer recess, which displaces molten metal when the block is rotated. The block preferably includes at least one gas inlet in communication with the hollow portion of the degasser shaft and a gas-release opening formed in each metal-transfer recess. Each gas-release opening communicates with one of the gas inlets. The coupling connects the degasser shaft to a drive shaft and is formed of two or more coupling members. Other methods of creating small bubbles in molten metals include injecting gas through a porous plug, lance or tube.

As used herein, "vortex" refers to a spinning, often turbulent, flow (or any spiral motion) with closed streamlines. The shape of media or mass swirling rapidly around a center forms a vortex. It flows in a circular motion.

As used herein, "directionally solidifying" refers to the solidification of molten metal by applying a temperature gradient to the metal while freezing so that molten feed metal is continually available for the portion undergoing solidification. With proper use of the measures, as the metal solidifies, the interface for the boundary between the liquid and solid metal moves towards a source of additional feed metal and away from the region where solidification began. Directional solidification can be used as a purification process. Since most impurities will be more soluble in the liquid than in the solid phase during solidification, impurities will be "pushed" by the solidification front, causing much of the finished casting to have a lower concentration of impurities than the feedstock material, while the last solidified metal will be enriched with impurities. This last part of the metal can be scrapped or recycled. The suitability of directional solidification in removing a specific impurity from a certain metal depends on the partition coefficient of the impurity in the metal in question, as described by the Scheil equation. Directional solidification is frequently employed as a purification step in the production of multicrystalline silicon for solar cells. Examples of directional solidification processes are Czochralski (Cz), Float Zone (Fz), Heat Exchange Method (HEM), Bridgeman, Zone refining, ElectroMagnetic casting (EMC), horizontal bridgeman etc.

As used herein, "solar cell" refers to a device that converts solar energy directly into electrical energy via the photoelectric effect. The device may be made primarily from a semiconductor, typically silicon As used herein, "silicon solar wafer" refers to a thin slice of highly purified silicon (either mono or multi-crystalline) which forms the substrate or basis of the of a solar cell.

As used herein, "rotary furnace" refers to a furnace system that may be electrically heated, gas or oil heated, or dual fuel fired. It consists of a turning (typically cylindrical) heated zone that can be seal such that the atmosphere can be controlled. The tumbling action of the product and slagging agent(s) and the atmosphere within the rotary furnace results in a high degrees of temperature uniformity and gas-solid contact. This results in a more homogenous product, reduced processing times and increased production rates. The intimate contact of all materials and gases within the rotary furnace ensures that any chemical or physical reactions are carried to completion As used herein, "slagging" refers to the act of adding specific oxides and or salts or other non-soluble materials to a molten metal such as silicon for the purpose of removing one or more elemental impurities from the melt. A technique used in the purification of metals.

As used herein, "gas injection" refers to the act of injecting a gas (such as oxygen, water vapor, hydrogen etc) into a bath of molten metal (such as silicon) in such a way as to ensure the maximum contact of the gas with the molten bath. The purpose of this contact is to react impurities within the melt with the gas in order to from new compounds which will separate from the melt resulting a metal bath that is relatively free of impurities.

As used herein, "vacuum treatment" refers to the act of subjecting a bath of molten metal such as silicon in a closed container to a pressure less than atmospheric for the purpose of removing impurities whose vapor pressure is greater than that of molten metal.

The term "solar panel" refers to a photovoltaic module which is an assembly of solar cells used to generate electricity. In all cases, the panels are typically flat, and are available in various heights and widths. An array is an assembly of photovoltaic (PV) modules; the panels can be connected either in parallel or series depending upon the design objective. Solar panels typically find use in residential, commercial, institutional, and light industrial applications.

As used herein, "mm" denotes millimeter, "ppm" denotes parts per million, "° C." refers to degrees Celsius, "wt. %" denotes weight percent, "hr" denotes hour, "kg" refers to kilogram, and "ppmwt. %" refers to parts per million weight percent.

Figure 2:
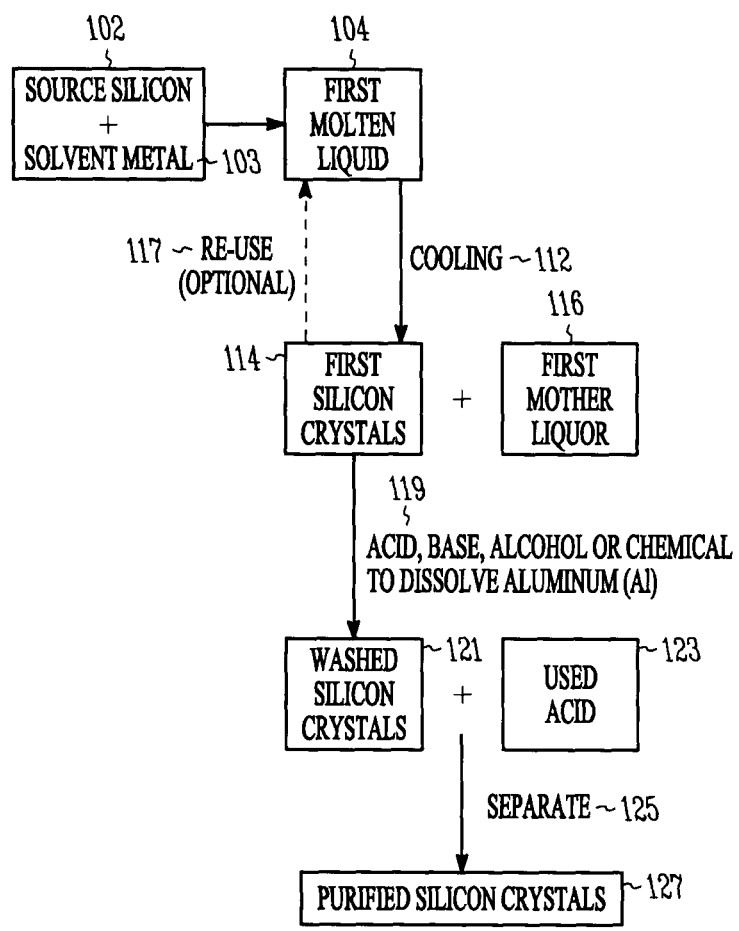
FIG. 2 illustrates a block flow diagram for methods of purifying silicon, methods for obtaining purified silicon, as well as methods for obtaining purified silicon crystals, purified granulized silicon, silicon chunks and/or purified silicon ingots
Figure 3A:
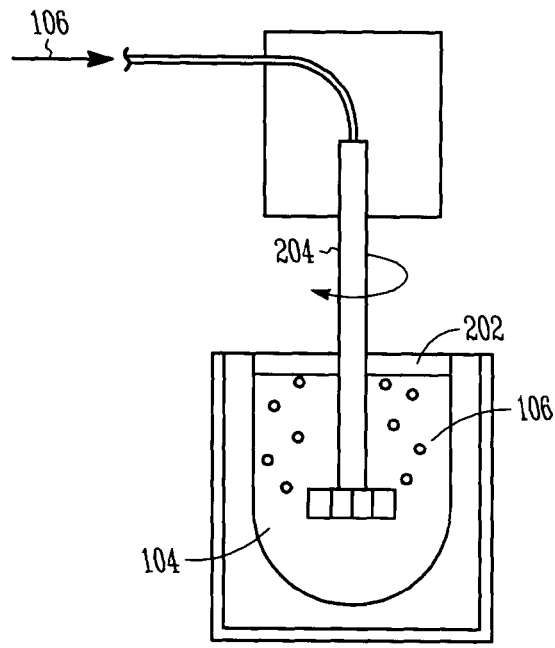
FIGS. 3A-B illustrate an exemplary apparatus system useful for practicing the methods of the invention.
Figure 3B:
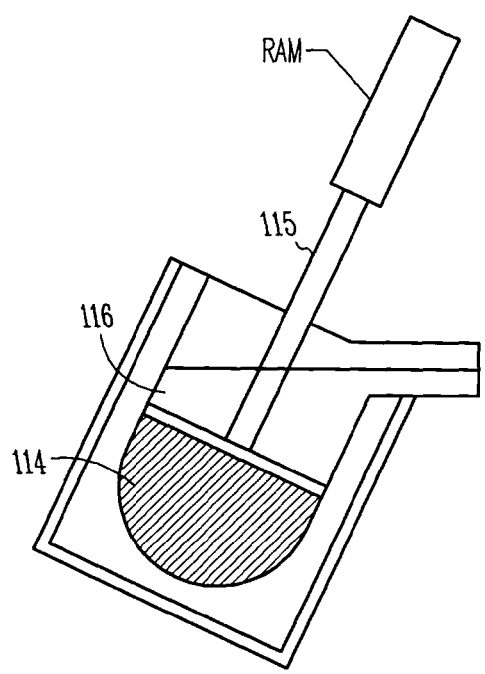

Referring to FIG. 1, methods of purifying silicon, and methods for obtaining purified silicon are provided. Referring to FIG. 2, an exemplary apparatus system useful for practicing the methods of the invention is provided.

Briefly stated, a first molten liquid (104) is formed from source silicon (102) and a solvent metal (103). The first molten liquid (104) is contacted with a first gas (106), to provide a second molten liquid (108) and dross (110). The dross (110) may be removed. The second molten liquid (108) is cooled to provide first silicon crystals (114) and a first mother liquor (116). The first mother liquor (116) may be separated from the first silicon crystals (114). The first silicon crystals (114) can either be re-used (117), as described below, or contacted with an acid, base, alcohol or chemical that can dissolve, digest or favorably react with the solvent metal (119) to provide a washed silicon crystals (121) and used acid (123). The washed silicon crystals (121) and used acid (123) can be separated (125) to provide purified silicon crystals (127).

As stated above, a first molten liquid (104) is formed from source silicon (102) and a solvent metal (103). Preferably, the first molten liquid (104) should be completely molten, with no appreciable amount of slush present. Alternatively, the first molten liquid (104) may include an appreciable amount of slush present.

In one example, after separating the second molten liquid (108) from the dross (110), the second molten liquid (108) may be transferred to a second vessel, such as a second furnace. In another example, after separating the first silicon crystals (114), the first mother liquor (116) may be transferred to a second or third vessel, such as a furnace. By utilizing second or subsequent vessels, a higher purity may be achieved. When transferring the molten liquid or mother liquor, a substantial amount of contaminants may be retained on the previous vessel, therefore acting as a separation or filtration step.

Optionally, before forming a first molten liquid (104), the source silicon (102) may be pre-treated. Pre-treatment may include slagging, gas injection, plasma torch, vacuum treatment or some combination thereof. Pre-treatment may occur in an induction furnace, electric resistance furnace or rotary furnace, or a combination thereof. In addition or alternatively, titanium (Ti), vanadium (V), chromium (Cr), zirconium (Zr), calcium (Ca), hafnium (Hf), magnesium (Mg), strontium (Sr) or some combination thereof may be added to the source silicon (102). The addition may occur before contacting with a gas, after contacting with a gas, or to the first molten liquid (104) if no gas introduction step is utilized, for example. Pre-treatment may lower boron and phosphorus levels in the source silicon (102). Alternatively, source silicon (102) may be added to the furnace in addition with silicon dioxide and aluminum, providing a silicon and aluminum mixture. An aluminum oxide dross may be formed.

If re-used (117), the first silicon crystals (114) may be heated or melted with a solvent metal (103) and re-introduced as the first molten liquid (104). For example, the crystals (114) may be melted with molten metal in a ratio of about 20% silicon crystals and about 80% aluminum, about 50% silicon crystals and about 50% aluminum, or about 60% silicon and about 40% aluminum. An aluminum alloy may also be used.

Any suitable source silicon (102) can be employed. For example, metallurgical grade silicon or aluminum smelter grade silicon (e.g., 553, 441, 2202, 1502, 1101, etc.) can be employed as the source silicon (102). Additionally, the source silicon (102) employed can include an appreciable amount (e.g., above about 10.0 ppm wt. %, above about 50.0 ppmwt. %, or above about 100 ppmwt. %) of impurities, such as phosphorous and boron. For example, the source silicon (102) can be about 95 wt. % to about 99.9 wt. % pure. More specifically, the source silicon (102) can include about 5 ppmwt % to about 15 ppmwt % boron and about 30 ppmwt % to about 60 ppmwt % phosphorous. In one specific embodiment, the source silicon (102) employed can be the first silicon crystals (114) obtained in a previous purification.

The solvent metal (103) can include any suitable metal, combination of metals, or an alloy thereof, which upon heating, can effectively dissolve the silicon, resulting in a molten liquid. Suitable exemplary solvent metals (103) include, e.g., copper, tin, zinc, antimony, silver, bismuth, aluminum, cadmium, gallium, indium, magnesium, lead, an alloy thereof, and combinations thereof One specific solvent metal (103) is aluminum, or an alloy thereof.

The source silicon (102) and solvent metal (103) can each be present in any suitable amount or ratio, provided the first molten liquid (104) can effectively be formed. For example, the source silicon (102) can be employed in about 20 wt. % to about 60 wt. %, and aluminum, or an alloy thereof, can be employed as the solvent metal (103), in about 40 wt. % to about 80 wt. %. More specifically, the source silicon (102) may be about 40% and aluminum about 60% of the first molten liquid (104).

As stated above, the first molten liquid (104) is contacted with a first gas (106), to provide a second molten liquid (108) and dross (110). Without being bound to any particular theory, it is believed that the first gas (106) alters the wetting angle of the surface of the bubbles (202) and the first molten liquid (104). This causes undesirable inclusions or precipitates to stick to the surface of the bubbles so that they can be dragged to the surface of the melted and left in the dross (110). Further, the gas (106) may react to form salts (e.g., $MgCl_2$, $CaCl_2$ $SrCl_2$ and NaCl) from the first molten liquid (104), which move to the surface where they can be removed with the dross (110). Specifically, inclusions and precipitates are pulled to the surface of the second molten liquid (108) by adhesion to the first gas (106) bubbles (202), where they can be removed as dross (110). As such, relatively small bubbles (202), having a relatively large surface area to volume ratio than larger bubbles and, are particularly suitable in the present invention. The small bubbles (202) may be about 1 mm to about 5 mm in size, for example.

The first gas (106) employed can be directly introduced into the vessel containing the first molten liquid (104). In such a situation, at least one of chlorine ($Cl_2$), oxygen ($O_2$), nitrogen ($N_2$), helium (He), argon (Ar), hydrogen ($H_2$), sulfur hexafluoride ($SF_6$), phosgene ($COCl_2$), carbon tetrachloride $CCl_4$, water vapor ($H_2O$), oxygen ($O_2$), carbon dioxide ($CO_2$), carbon monoxide (CO), tetrachlorosilane ($SiCl_4$) and tetrafluorosilane (SiF4) could be directly introduced into the vessel containing the first molten liquid (104). The first gas may be introduced or contacted more than once. Chlorine may be introduced, followed by oxygen, for example. Alternatively, the first gas (106) employed can be introduced into the vessel containing the first molten liquid (104) as a precursor, that can effectively evolve the first gas (106). The precursor itself can be a solid or liquid or salt flux. For example, the first gas may be formed by contacting the first molten liquid with a liquid, solid, or combination thereof to effectively evolve the first gas. Typically, the liquid or solid precursor will undergo a chemical reaction or decomposition to release the first gas (106), under the relatively high temperature of the first molten liquid (104).

In one specific embodiment, the first gas (106) includes 100 wt. % chlorine ($Cl_2$). In another specific embodiment, the first gas (106) includes chlorine ($Cl_2$) and nitrogen ($N_2$). In another specific embodiment, the first gas (106) includes chlorine ($Cl_2$) and nitrogen ($N_2$), in a ratio of up to about 1:4, up to about 1:6 or up to about 1:10, for example. The first gas (106) may include about 30% chlorine and about 70% nitrogen, about 15% chlorine and about 85% nitrogen or about 5% chlorine and about 95% nitrogen, for example.

In one embodiment, the first molten liquid (104) can contact the first gas (106) employing a rotary degasser (204). The rotary degasser (204) can effectively introduce the first gas (106) into the first molten liquid (104). Additionally, the rotary degasser (204) can effectively agitate (e.g., stir) the first molten liquid (104) while the first gas (106) is introduced into the first molten liquid (104), creating relatively small bubbles. The bubbles may be about 1 mm to about 5 mm, for example.

The dross (110) can subsequently be removed from the second molten liquid (108), for example, using a skimmer. Typically, the dross (110) can be a white, grey or black powder, semi-solid dross with oxides mixed with mother liquor, located on the surface of the second molten liquid (108). The second molten liquid (108) may be filtered for inclusions (e.g., titanium diboride inclusions) or precipitates, such as by utilizing a ceramic foam filter, filter bed, cake filtration in a filter bed or fiberglass cloth. The filtering may also remove any elements added to the source silicon (102) as part of a pre-treatment process. In one optional embodiment, the rotary degasser (204) can create a vortex of the second molten liquid (108), which can effectively mix the dross (110) in the second molten liquid (108). In such an embodiment, the vortex can contact oxygen to provide additional dross (110).

In one embodiment, the first molten liquid (104) can be cooled, prior to contacting with the first gas (106). Specifically, the first molten liquid (104) can be cooled, prior to contacting with the first gas (106), to just above the liquidus temperature (e.g., within about 50° C. above the liquidus temperature) or cooled to a temperature between the liquidus and solidus temperatures. The desired temperature will be dependent on the ratio of silicon and solvent metal in the mixture.

In one embodiment, the second molten liquid (108) can be heated after the first molten liquid (104) is contacted with the first gas (106), and before the dross (110) and second molten liquid (108) are separated. Specifically, the second molten liquid (108) can be heated, above the liquidus temperature, after the first molten liquid (104) is contacted with the first gas (106), and before the dross (110) and second molten liquid (108) are separated. More specifically, the second molten liquid (108) can be heated, to within about 20° C. above the liquidus temperature, after the first molten liquid (104) is contacted with the first gas (106), and before the dross (110) and second molten liquid (108) are separated.

As stated above, the second molten liquid (108) is cooled (112) to provide first silicon crystals (114) and a first mother liquor (116). In one embodiment, the second molten liquid (108) can be cooled (112) while agitating the second molten liquid (108). Without being bound to any particular theory, it is believed that during the cooling (112), agitating can provide relatively small silicon crystals (114), which can be difficult to strain, of a relatively high purity. A small amount of mixing can provide silicon crystals (114) of about 1 mm (thickness), by about 3 mm (width), by about 3 mm (length).

Additionally, the second molten liquid (108) can be cooled (112) to any suitable and appropriate temperature, provided first silicon crystals (114) are obtained in a first mother liquor (116). Specifically, the second molten liquid (108) can be cooled (112) close to, but above the solidus temperature (e.g., within about 100° C. above the solidus temperature, within about 125° C. above the solidus temperature, or within about 150° C. above the solidus temperature). More specifically, the second molten liquid (108) can be cooled (112) to above the solidus temperature and below the liquidus temperature. The desired temperature depends on ratio of silicon to solvent metal and also on the type and amount of pre-treatment elements added to the mixture.

The second molten liquid (108) can be cooled (112) at any suitable rate, provided first silicon crystals (114) are obtained in a first mother liquor (116) with an acceptable purity. The second molten liquid (108) can be cooled (112) over any suitable and appropriate period of time, provided first silicon crystals (114) are obtained in a first mother liquor (116). For example, the second molten liquid (108) can be cooled (112) over a period of time of at least about 1 hour, at least about 8 hours or at least about 24 hours.

In one embodiment, the first silicon crystals (114) and the first mother liquor (116) can be separated. The separation can be carried out in any suitable and appropriate manner. For example, the separation can be carried out by pouring off the first mother liquid (116) from the first silicon crystals (114). Alternatively, the separation can be carried out employing centrifugation. As can be seen in FIG. 2(b), a strainer (115) can be employed to apply pressure to the first silicon crystals (114), thereby assisting in the separation.

In one specific embodiment, the first silicon crystals (114) obtained can be employed or re-used (117) as the second molten liquid (108) in a subsequent purification. This re-use or recycling (117) can be carried out multiple times (e.g., 2, 3, 4 or 5), to provide second molten liquid (108) having a requisite purity level. In such an embodiment, aluminum (Al) can be added to the first silicon crystals (114), prior to forming the subsequent second molten liquid (108).

The first silicon crystals (114) can be separated from the first mother liquor (116), employing any suitable and effective technique. The first silicon crystals (114) are contacted with an acid, base, alcohol or chemical capable of dissolving the solvent metal, to provide washed silicon crystals (121) and used acid (123). The washed silicon crystals (121) and used acid (123) can be separated, to provide purified silicon crystals. Used acid (123) refers to not only any used acid present, but also used base, alcohol or other chemical used to dissolve, digest or favorably react with the solvent metal. Used acid refers to one or more of such materials present after contacting with first silicon crystals (114).

The acid may include hydrochloric (HCl), nitric ($HNO_3$), sulfuric ($H_2SO_4$), hydrofluoric (HF), acetic acid, water or a combination thereof. The acid may include about 8 molar acid; and water. For example, the 8 molar acid may include about 95% (v) hydrochloric (HCl) and about 5% (v) nitric ($HNO_3$), sulfuric ($H_2SO_4$), hydrofluoric (HF), or a combination thereof. Bases utilized, such as alkalis, may include sodium hydroxide (NaOH) and potassium hydroxide (KOH). The washed silicon crystals may include about 800 ppm (wt.)

to about 2,000 ppm (wt) aluminum (Al), as measured by an Inductively Coupled Plasma Optical Emission Spectrometer (ICPOES).

Referring to FIG. 2, methods of purifying silicon, and methods for obtaining purified silicon are provided. Briefly stated, a first molten liquid (104) is formed from source silicon (102) and a solvent metal (103). The first molten liquid (104) is cooled to provide first silicon crystals (114) and a first mother liquor (116). The first silicon crystals (114) can either be re-used (117), as described below, or contacted with an acid, base, alcohol or chemical (119) that can effectively dissolve or digest aluminum, to provide a washed silicon crystals (121) and used acid (123). The washed silicon crystals (121) and used acid (123) can be separated (125) to provide purified silicon crystals (127).

As stated above, the first molten liquid (104) is cooled (112) to provide first silicon crystals (114) and a first mother liquor (116). In one embodiment, the first molten liquid (104) can be cooled (112) while agitating. Without being bound to any particular theory, it is believed that during the cooling (112), agitating can provide relatively small silicon crystals (114), which can be difficult to strain, of a relatively high purity. A small amount of mixing can provide silicon crystals (114) of about 1 mm (thickness), by about 3 mm (width), by about 3 mm (length). If the crystals are not mixed, they may be up to about 1 mm (thickness), by about 15 mm (width), by about 15 mm (length) or up to about 2 mm (thickness), by about 60 mm (width), by about 60 mm (length) in size.

Additionally, the first molten liquid (104) can be cooled (112) to any suitable and appropriate temperature, provided first silicon crystals (114) are obtained in a first mother liquor (116). More specifically, the first molten liquid (104) can be cooled (112) to above the solidus temperature and below the liquidus temperature.

The first molten liquid (104) can be cooled (112) at any suitable any appropriate rate, provided first silicon crystals (114) are obtained in a first mother liquor (116). The first molten liquid (104) can be cooled (112) over any suitable and appropriate period of time, provided first silicon crystals (114) are obtained in a first mother liquor (116). For example, the first molten liquid (104) can be cooled (112) over a period of time of at least about 1 hour, at least about 8 hours or at least about 24 hours.

In one embodiment, the first silicon crystals (114) and the first mother liquor (116) can be separated. The separation can be carried out in any suitable and appropriate manner. For example, the separation can be carried out by pouring off the first mother liquor (116) from the first silicon crystals (114). Alternatively, the separation can be carried out employing centrifugation. As can be seen in FIG. 2(b), a strainer (115) can be employed to apply pressure to the first silicon crystals (114), thereby assisting in the separation.

In one specific embodiment, the first silicon crystals (114) obtained can be employed or re-used (117) as part of the first molten liquid (104) in a subsequent purification. This re-use or recycling (117) can be carried out multiple times (e.g., 2, 3, 4 or 5), to provide first molten liquid (104) having a requisite purity level. In such an embodiment, aluminum (Al) can optionally be added to the first silicon crystals (114), prior to forming the subsequent first molten liquid (104).

The first silicon crystals (114) can be separated from the first mother liquor (116), employing any suitable and effective technique. The first silicon crystals (114) are contacted with an acid, to provide washed silicon crystals (121) and used acid (123). The washed silicon crystals (121) and used acid (123) can be separated, to provide purified silicon crystals.

Once the purified silicon crystals are obtained, regardless of which of the above methods are utilized, the crystals may be melted in a furnace to provide molten silicon. The molten silicon may then be contacted with a gas, such as substantially pure $O_2$ (e.g., 99.5% $O_2$) and then optionally filtered. The silicon may be directionally solidified to provide silicon ingots. The top of the ingot may be optionally removed, such as by cutting, breaking or pouring off the top of a partially molten ingot. The silicon may be post-treated, such as by gas injection (e.g., using water, hydrogen, argon or oxygen), slagging, plasma torch or vacuum treatment. Post-treatment may occur in an induction furnace, electric resistance furnace, rotary furnace or a combination thereof to reduce the boron, aluminum and phosphorus levels. Gas injection may occur by utilizing a rotary degasser, lance or porous plug in a furnace, for example. Optionally, the silicon may be directionally solidified to provide multicrystalline ingots or monocrystalline boules. Directional solidification may be repeated numerous times.

Figure 4:
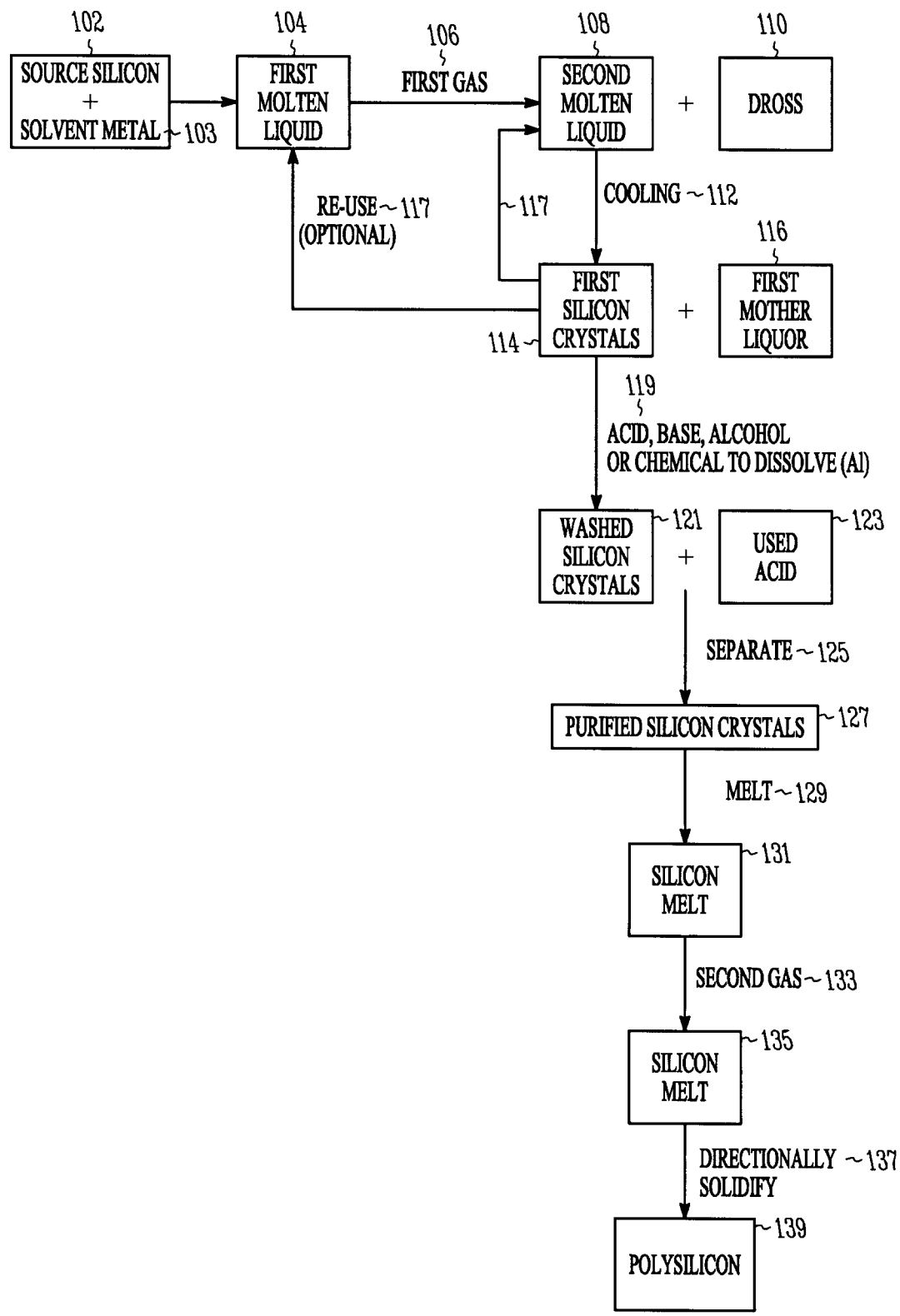
FIG. 4 illustrates a block flow diagram for method of purifying silicon including contacting with a first and second gas, methods for obtaining purified silicon, as well as methods for obtaining purified silicon crystals, purified granulized silicon, silicon chunks and/or purified silicon ingots.

Referring to FIG. 4, one example of a method for purifying silicon is shown, including forming a first molten liquid (104) from a source silicon (102) and a solvent metal (103), such as aluminum; contacting the first molten liquid (104) with a first gas (106), to provide dross (110) and a second molten liquid (108); separating the dross and the second molten liquid (108); cooling (112) the second molten liquid to form first silicon crystals (114) and a first mother liquor (116) and then separating the first silicon crystals and the first mother liquor. The first silicon crystals (114) may be re-used (117) by melting with a solvent metal (103) to form another first molten liquid (104) or melted with a solvent metal (103) and contacted with a gas to form a second molten liquid (108). The method also optionally includes melting the first silicon crystals with a solvent metal and repeating the above steps.

The first silicon crystals (114) may be contacted with an acid, base, alcohol or chemical capable of dissolving the aluminum or solvent metal (119), to provide washed silicon crystals (121) and used acid (123). The washed silicon crystals (121) may be separated (125) from the used acid (123), sufficient to provide purified silicon crystals (127). The purified silicon crystals (127) may then be melted (129) to form a silicon melt (131). A second gas (133), such as oxygen, may contact the silicon melt (131). The silicon melt 135 contacted with a second gas, may then be directionally solidified (137) to form polysilicon (139).

In one embodiment, the first silicon crystals (114) are crushed to approximately about 1 mm to about or smaller pieces, prior to contacting with the acid.

The analytical results from an exemplary GDMS testing in ppm (wt) after the acid leaching are provided below.

| Li | Be | B | Na | Mg | Al | P | S | Cl | K | Ca | Ti | V | Cr | Mn | Fe | Ni | Cu | Zn | Sr |
|---|---|---|---|---|---|---|---|---|---|---|---|---|---|---|---|---|---|---|---|
| .005 | .005 | <3 | <.08 | <.25 | <350 | <9 | <.2 | <4 | <.1 | <1.0 | <0.13 | <0.05 | <.05 | <.03 | .005 | <.08 | <.05 | <.05 | <.03 |

The analytical results from an exemplary GDMS testing in ppm (wt) after acid leaching

| Li | Be | B | Na | Mg | Al | P | S | Cl | K | Ca | Ti | V | Cr | Mn | Fe | Ni | Cu | Zn | Sr |
|---|---|---|---|---|---|---|---|---|---|---|---|---|---|---|---|---|---|---|---|
| .005 | .005 | <2 | <.08 | <.25 | <350 | <3 | <.2 | <4 | <.1 | <1.0 | <0.13 | <0.05 | <.05 | <.03 | .005 | <.08 | <.05 | <.05 | <.03 | and repeating steps:

(a) forming a first molten liquid from silicon and a solvent metal selected from the group of copper, tin, zinc, antimony, silver, bismuth, aluminum, cadmium, gallium, indium, magnesium, lead, an alloy thereof, and combinations thereof;

(b) contacting the first molten liquid with a first gas, to provide dross and a second molten liquid;

(c) separating the dross and the second molten liquid;

(d) cooling the second molten liquid to form first silicon crystals and a first mother liquid; and (e) separating the first silicon crystals and the first mother liquid.

The methods described herein can effectively provide commercial quantities (e.g., at least about 240 kg) of purified silicon crystals, in a relatively cost-effective manner, and in a relatively short period of time (e.g., within about 24-94 hours). The methods described herein can effectively provide at least about 100 tons/year of purified silicon, in a relatively cost-effective manner, and in a relatively short period of time (e.g., within about 24-94 hours). The relatively pure silicon obtained can subsequently be further processed to provide a solar panels, solar cells, wafers or integrated circuits.

The relatively pure silicon obtained can be purified from all elements of the periodic table, including at least one of lithium (Li), boron (B), sodium (Na), titanium (Ti), iron (Fe), magnesium (Mg), vanadium (V), zinc (Zn), phosphorous (P), sulfur (S), potassium (K), calcium (Ca), strontium (Sr), chlorine (Cl), chromium (Cr), manganese (Mn), aluminum (Al), arsenic (As), antimony (Sb), gallium (Ga), indium (In), nickel (Ni) and copper (Cu). Embodiments of then invention may provide relatively pure silicon including any one or more of the following, each in less than about 15 ppm: lithium (Li), boron (B), sodium (Na), titanium (Ti), iron (Fe), magnesium (Mg), vanadium (V), zinc (Zn), phosphorous (P), sulfur (S), potassium (K), calcium (Ca), strontium (Sr), chlorine (Cl), chromium (Cr), manganese (Mn), aluminum (Al), arsenic (As), antimony (Sb), gallium (Ga), indium (In), nickel (Ni) and copper (Cu). More specifically, the relatively pure silicon obtained can include any one or more of the following, each in less than about 5 ppm: iron (Fe) and aluminum (Al). Additionally, the relatively pure silicon obtained can include any one or more of the following, each in less than about 1 ppm: lithium (Li), boron (B), sodium (Na), titanium (Ti), magnesium (Mg), vanadium (V), zinc (Zn), phosphorous (P), sulfur (S), potassium (K), calcium (Ca), strontium (Sr), chlorine (Cl), chromium (Cr), manganese (Mn), arsenic (As), antimony (Sb), gallium (Ga), indium (In), nickel (Ni), copper (Cu), iron (Fe) and aluminum (Al).

Any of the above steps may be carried out in a high purity refractory. The refractory may contain low levels of boron and phosphorus. The refractory material may be fused silica or 65-85% silica, for example. Any vessels (e.g., crucible) used above may be manufactured or line with quartz, fused silica, graphite, $Si_3N_4$ or SiC, for example. The vessel may have a high purity mould wash (coating) with low P and B levels.

EXAMPLE 1

A 950 lb mixture of 40% metallurgical Silicon and 60% primary aluminum was melted and heated to 975° C. in a furnace. 0.25 lb of Ca was added to the melt by using an aluminum-calcium master alloy. The dross was skimmed off the surface of the melt. The temperature was lowered to 950° C. and 85% $N_2$ and 15% $Cl_2$ gas was injected into the molten mixture for 3 hrs through a rotary degasser followed by 100% $N_2$ gas for 15 minutes. The dross was skimmed off of the surface of the melt every 30 minutes. The mixture was heated up to 1000° C. The molten mixture was poured into a new furnace and the temperature was lowered over 8 hrs to 750° C. The molten mother liquor was then poured out of the furnace and the remaining silicon crystals/flakes were raked out of the furnace. The silicon flakes/crystals were then melted with aluminum in a 50-50 wt % ratio in a furnace. The gas injection, dross removal and crystal growing procedure were repeated. The flakes were then placed in a solution of 8 wt % HCl+water and the aluminum was dissolved off of the flakes for 72 hrs. The flakes were then strained from the acid and dried. The dried flakes where then melted in a furnace. Once melted, 99.5% $O_2$ was injected into the molten silicon through a lance for 3 hrs. The dross or slag was skimmed off the furnace and the molten silicon was poured into a furnace that directionally solidified the silicon from the bottom up. The top of the silicon ingot was cut off and the remainder of the silicon was melted in a GT-DSS240 furnace made by GT Solar located in Merrimack, N.H. to give the silicon a directional solidification. The resulting polysilicon had a Boron level of 0.79-1.1 ppmw and P between 0.27-1.1 ppmw with other metals below 1 ppmw as measured by GDMS.

EXAMPLE 2

A 950 lb mixture of 40% metallurgical Silicon and 60% primary aluminum was melted and heated to 975° C. in a furnace. 1 lb of Ca was added to the melt by using an aluminum-calcium master alloy. The dross was skimmed off the surface of the melt. The temperature was lowered to 950° C. and 85% $N_2$ and 15% $Cl_2$ gas was injected into the molten mixture for 3 hrs through a rotary degasser followed by 100% $N_2$ gas for 15 minutes. The mixture was heated up to 975° C. and the dross was skimmed off the surface of the melt. The molten mixture was poured into a new furnace and the temperature was lowered over 8 hrs to 750° C. The molten mother liquor was then poured out of the furnace and the remaining silicon crystals/flakes were raked out of the furnace. The aluminum mother liquor can then be sold to the foundry industry to make aluminum castings. These flakes were then melted with aluminum in a 50-50 wt % ratio in a furnace. The gas injection, dross removal and crystal growing procedure were repeated. The flakes were then placed in a solution of 8 wt % HCl+water and the aluminum was dissolved off of the flakes for 48 hrs. The flakes were then strained from the acid and dried. The dried flakes where then melted in a GT-DSS240 GT furnace. The top of the silicon ingot was cut off and the remainder of the silicon was melted again in a GT-DSS240 furnace made by GT Solar located in Merrimack, N.H. to give the silicon a directional solidification. The resulting polysilicon had a Boron level of 0.85-1.1 ppmw and P between 0.41-1.1 ppmw with other metals below 1 ppmw as measured by GDMS.

EXAMPLE 3

A 950 lb mixture of 40% metallurgical Silicon and 60% primary aluminum was melted and heated to 975° C. in a furnace. The dross was skimmed off the surface of the melt. The molten mixture was poured into a new furnace and the temperature was lowered over 2 hrs to 750° C. The molten mother liquor was then poured out of the furnace and the remaining silicon crystals/flakes were raked out of the furnace. The flakes that had been grown were then placed in a solution of 8 wt % HCl+water and the aluminum was dissolved off of the flakes for 48 hrs. The flakes were then strained from the acid and dried. The dried flakes where then melted in a furnace. Once melted, 99.5% $O_2$ was injected into the molten silicon through a lance for 3 hrs. The dross or slag was skimmed off the furnace and the molten silicon was poured into a furnace that directionally solidified the silicon from the bottom up. The top of the silicon ingot was cut off and the remainder of the silicon was melted in a GT Solar DSS240 furnace to give the silicon a directional solidification.

EXAMPLE 4

A 950 lb mixture of 40% metallurgical Silicon and 60% primary aluminum was melted and heated to 975° C. in a furnace. The dross was skimmed off the surface of the melt. The temperature was lowered to 950° C. and 85% $N_2$ and 15% $Cl_2$ gas was injected into the molten mixture for 3 hrs through a rotary degasser followed by 100% $N_2$ gas for 15 minutes. The mixture was heated up to 975° C. and the dross was skimmed off the surface of the melt. The molten mixture was poured into a new furnace and the temperature was lowered over 8 hrs to 750° C. The molten mother liquor was then poured out of the furnace and the remaining silicon crystals/flakes were raked out of the furnace. The flakes that had been grown were then placed in a solution of 8 wt % HCl+water and the aluminum was dissolved off of the flakes for 72 hrs. The flakes were then strained from the acid and dried. The dried flakes where then melted in a furnace. Once melted, 99.5% $O_2$ was injected into the molten silicon through a lance for 3 hrs. The dross or slag was skimmed off the furnace and the molten silicon was poured into a furnace that directionally solidified the silicon from the bottom up. The top of the silicon ingot was cut off and the remainder of the silicon was melted in a GT-DSS240 furnace to give the silicon a directional solidification. The resulting polysilicon had a Boron level of 1.2-1.8 ppmw and P 0.5-2.0 ppmw with other metals below 1 ppmw as measured by GDMS.

EXAMPLE 5

A 950 lb mixture of 30% metallurgical Silicon and 70% primary aluminum are melted and heated to 850° C. in a furnace. 1 lb of titanium and 1 lb of Zirconium are added to the melt by adding a titanium aluminum master alloy. The dross is skimmed off the surface of the melt. The temperature is lowered to 800° C. and 95% $N_2$ and 5% $Cl_2$ gas is injected into the molten mixture for 4 hrs through a rotary degasser followed by 100% $N_2$ gas for 15 minutes. The dross is skimmed off the surface of the melt. The molten mixture is poured into a new furnace through a ceramic foam filter and the temperature is lowered over 8 hrs to 690° C. The molten mother liquor is then poured out of the furnace and the remaining silicon crystals/flakes are raked out of the furnace. The flakes that are grown are then placed in a solution of 8 wt % HCl+water and the aluminum is dissolved off of the flakes for 48 hrs. The flakes are then strained from the acid and dried. The dried flakes are then melted in a furnace. Once melted, 99.5% $O_2$ is injected into the molten silicon through a lance for 3 hrs. The dross or slag is skimmed off the furnace and the molten silicon is poured through a ceramic foam filter into a furnace that directionally solidifies the silicon from the bottom up. The silicon ingot is broken into chunks and the last silicon to freeze is removed.

EXAMPLE 6

Metallurgical grade silicon is melted in a furnace and has a mixture of Ar, $H_2O$ and $H_2$ gas injected into the molten silicon for 3 hrs through a lance. Aluminum is then added to bring the composition to 40% metallurgical Silicon and 60% primary aluminum and heated to 975° C. in a furnace. The dross is skimmed off the surface of the melt. The temperature is lowered to 950° C. and 85% $N_2$ and 15% $Cl_2$ gas is injected into the molten mixture for 3 hrs through a rotary degasser followed by 100% $N_2$ gas for 15 minutes. The mixture is heated up to 975° C. and the dross is skimmed off the surface of the melt. The molten mixture is poured into a new furnace and the temperature is lowered over 8 hrs to 750° C. The molten mother liquor is then poured out of the furnace and the remaining silicon crystals/flakes are raked out of the furnace. The flakes that are grown are then placed in a solution of 8 wt % HCl+water and the aluminum is dissolved off of the flakes for 48 hrs. The flakes are then strained from the acid and dried. The dried flakes are then melted in a furnace. Once melted, 99.5% $O_2$ is injected into the molten silicon through a lance for 3 hrs. Slag made of $SiO_2$, $Na_2SiO_3$, and CaO is added to the surface of the molten silicon during gas injection. The slag is pulled under the surface by the induction furnace currents in the molten silicon. The dross or slag is skimmed off the furnace and the molten silicon is poured into a furnace that directionally solidified the silicon from the bottom up. The top of the silicon ingot is cut off and the remainder of the silicon is remelted and then poured back into the direction solidification furnace and directionally solidified from the bottom up again. The top is then cut off.

EXAMPLE 7

A 950 lb mixture of 40% metallurgical Silicon and 60% primary aluminum is melted and heated to 975° C. in a furnace. The dross is skimmed off the surface of the melt. The temperature is lowered to 950° C. and 85% $N_2$ and 15% $Cl_2$ gas is injected into the molten mixture for 3 hrs through a rotary degasser followed by 100% $N_2$ gas for 15 minutes. The mixture is heated up to 975° C. and the dross is skimmed off the surface of the melt. The molten mixture is poured into a new furnace and the temperature is lowered over 8 hrs to 750° C. The molten mother liquor is then poured out of the furnace into a second furnace. The remaining silicon crystals/flakes are raked out of thee furnace. The mother liquor in the $2^{nd}$ furnace is allowed to cool to 650° C. in the $2^{nd}$ furnace and then the second mother liquor is poured out and the flakes/crystals are raked out of the $2^{nd}$ furnace. This increases the amount of flakes that can be made from one heat. The flakes that are grown are then placed in a solution of 8 wt % HCl+water and the aluminum is dissolved off of the flakes for 48 hrs. The flakes are then strained from the acid and dried. The dried flakes are then melted in a furnace. Once melted, air is injected into the molten silicon through a lance for 4 hrs. The dross or slag is skimmed off the furnace and the molten silicon is poured into a furnace that directionally solidified the silicon from the bottom up. The top of the silicon ingot is cut off and the remainder of the silicon is melted in a GT Solar DSS240 furnace to give the silicon a directional solidification.

Embodiments

1. A method for purifying silicon, the method comprising:
   (a) forming a first molten liquid from a source silicon and a solvent metal selected from the group of copper, tin, zinc, antimony, silver, bismuth, aluminum, cadmium, gallium, indium, magnesium, lead, an alloy thereof, and combinations thereof;
   (b) contacting the first molten liquid with a first gas, to provide dross and a second molten liquid;
   (c) separating the dross and the second molten liquid;
   (d) cooling the second molten liquid to form first silicon crystals and a first mother liquor;
   (e) separating the first silicon crystals and the first mother liquor;
   (f) contacting the first silicon crystals with an acid, base, alcohol or chemical capable of dissolving the solvent metal, to provide washed silicon crystals and used acid; and
   (g) separating the washed silicon crystals and the used acid.
2. The method of embodiment 1, further comprising before forming a first molten liquid, pre-treating source silicon by slagging, gas injection, plasma torch, vacuum treatment, or a combination thereof.
3. The method of embodiment 1, further comprising before forming a first molten liquid, adding titanium (Ti), vanadium (V), chromium (Cr), zirconium (Zr), calcium (Ca), hafnium (Hf), magnesium (Mg), strontium (Sr) or a combination thereof to the source silicon.
4. The method of embodiment 1, wherein contacting with a first gas provides small bubbles.
5. The method of embodiment 1, further comprising filtering the second molten liquid.
6. The method of embodiment 1, wherein in step (a), the first molten liquid is formed by heating above the liquidus temperature.
7. The method of embodiment 1, wherein in step (a), metallurgical grade silicon is employed with a phosphorous level below 60 ppmw and boron level below 15 ppmw.
8. The method of embodiment 1, wherein in step (a), silicon is employed in about 20 wt. % to about 60 wt. %.
9. The method of embodiment 1, wherein in step (a), aluminum, or an alloy thereof, is employed as the solvent metal, in about 40 wt. % to about 80 wt. %.
10. The method of embodiment 1, wherein step (b) is carried out while agitating the first molten liquid.
11. The method of embodiment 1, wherein step (b) is carried out employing a rotary degasser.
12. The method of embodiment 1, wherein after step (a) and before step (b), the first molten liquid is cooled to below the liquidus temperature.
13. The method of embodiment 1, wherein after step (a) and before step (b), the first molten liquid is cooled to slightly above the liquidus temperature.
14. The method of embodiment 1, wherein in step (c), the dross is removed from the surface of the second molten liquid.
15. The method of embodiment 1, wherein after step (c), the second molten liquid is transferred to a second vessel.
16. The method of embodiment 1, wherein in step (d), the second molten liquid is cooled to above the solidus temperature and below the liquidus temperature.
17. The method of embodiment 1, wherein step (d) is carried out while agitating the second molten liquid.
18. The method of embodiment 1, wherein step (e) is carried out by pouring off the first mother liquid from the first silicon crystals.
19. The method of embodiment 1, wherein after step (e) and before step (f), repeating steps (a)-(e).
20. The method of embodiment 1, wherein after step (e) and before step (f), repeating steps (a), (c), (d) and (e).
21. The method of embodiment 1, wherein the separating in step (g) is carried out employing a strainer.
22. The method of embodiment 1, wherein at least one of steps (a)-(g) is carried out multiple times.
23. The method of embodiment 1, wherein each of steps (a)-(g) is independently carried out multiple times.
24. The method of embodiment 1, wherein the first silicon crystals comprise silicon in about 85 wt. % to about 98 wt. %.
25. The method of embodiment 1, wherein the washed silicon crystals comprise about 800 ppm (wt.) to about 2,000 ppm (wt) aluminum (Al).
26. The method of any one of embodiments 1-25, wherein the silicon is purified from at least one of lithium (Li), boron (B), sodium (Na), titanium (Ti), iron (Fe), magnesium (Mg), vanadium (V), zinc (Zn), phosphorous (P), sulfur (S), potassium (K), calcium (Ca), strontium (Sr), chlorine (Cl), chromium (Cr), manganese (Mn), aluminum (Al), arsenic (As), antimony (Sb), gallium (Ga), indium (In), nickel (Ni) and copper (Cu).
27. The method of embodiment 1, wherein the washed silicon crystals includes less than about 9 ppm (wt) phosphorous (P) and less than about 3 ppm (wt) boron (B).
28. The method of any one of embodiments 18-19, wherein the washed silicon crystals includes less than about 4 ppm (wt) phosphorous (P) and less than about 2 ppm (wt) boron (B).
29. The method of any one of embodiments 1-28, wherein at least about 100 tons/year of the washed silicon crystals is obtained.
30. The method of any one of embodiments 1-29, wherein the method is carried out in less than about 24 hours.
31. The method of embodiments 1, further comprising processing the washed crystals sufficient to provide solar cells, solar panels, wafers or integrated circuits.
32. The method of embodiment 31, wherein the processing the washed silicon crystals comprises at least one of:
   (a) vacuum treatment,
   (b) slag treatment,
   (c) gas injection, with one or more of oxygen, water, hydrogen and argon;
   (d) directional solidification, and
   (e) employing the washed silicon crystals as feedstock for a silane/Siemen's gas process.
33. The method of any one of embodiments 1-32, further comprising purifying the washed silicon crystals to provide solar grade silicon that is mixed with other silicon to provide solar panel grade silicon.
34. A method for purifying silicon, the method comprising:
   (a) forming a first molten liquid from source silicon and a solvent metal selected from the group of copper, tin, zinc, antimony, silver, bismuth, aluminum, cadmium, gallium, indium, magnesium, lead, an alloy thereof, and combinations thereof;

(b) cooling the first molten liquid to form first silicon crystals and a first mother liquid;
(c) separating the first silicon crystals and the first mother liquid;
(d) contacting the first silicon crystals with an acid, base alcohol or chemical that will dissolve aluminum to provide washed silicon crystals and used acid; and
(e) separating the washed silicon crystals and the used acid.

35. The method of embodiment 34, wherein in step (a), the first molten liquid is formed by heating above the liquidus temperature.
36. The method of embodiment 34, wherein in step (a), metallurgical grade silicon is employed with a phosphorous level below 60 ppmw and boron level below 15 ppmw.
37. The method of embodiment 34, wherein in step (a), silicon is employed in about 20 wt. % to about 60 wt. %.
38. The method of embodiment 34, wherein in step (a), aluminum, or an alloy thereof, is employed as the solvent metal, in about 40 wt. % to about 80 wt. %.
39. The method of embodiment 34, wherein in step (b), the second molten liquid is cooled to slightly above the solidus temperature and below the liquidus temperature.
40. The method of embodiment 34, wherein step (c) is carried out by pouring off the first mother liquid from the first silicon crystals.
41. The method of embodiment 34, wherein aluminum is contacted with the first silicon crystals, and melted to provide a subsequent second molten liquid.
42. The method of embodiment 34, wherein the separating in step (e) is carried out employing a strainer.
43. The method of embodiment 34, wherein at least one of steps (a)-(e) is carried out multiple times.
44. The method of embodiment 34, wherein each of steps (a)-(e) is independently carried out multiple times.
45. The method of embodiment 34, wherein the first silicon crystals comprise silicon in about 85 wt. % to about 99 wt. %.
46. The method of embodiment 34, wherein the washed silicon crystals comprise about 500 ppm (wt.) to about 2,000 ppm (wt) aluminum (Al).
47. The method of any one of embodiments 1-46, wherein the silicon is purified from at least one of lithium (Li), boron (B), sodium (Na), titanium (Ti), iron (Fe), magnesium (Mg), vanadium (V), zinc (Zn), phosphorous (P), sulfur (S), potassium (K), calcium (Ca), strontium (Sr), chlorine (Cl), chromium (Cr), manganese (Mn), aluminum (Al), arsenic (As), antimony (Sb), gallium (Ga), indium (In), nickel (Ni) and copper (Cu).
48. The method of embodiment 34, wherein the washed silicon includes less than about 15 ppm (wt) phosphorous (P) and less than about 5 ppm (wt) boron (B).
49. The method of any one of embodiments 1-48, wherein at least about 100 tons/year of the washed silicon crystals is obtained.
50. The method of any one of embodiments 1-49, wherein the method is carried out in less than about 24 hours.
51. The method of any one of embodiments 34-50, further comprising purifying the washed silicon crystals to provide solar grade silicon that is mixed with other silicon to provide solar panel grade silicon.
52. The method of any one of embodiments 1-51, further comprising purifying the washed silicon crystals to provide solar grade silicon that is mixed with other silicon to provide solar panel grade silicon.
53. The method of embodiment 52, wherein the purifying the washed silicon crystals to provide solar grade silicon comprises at least one of:

(a) vacuum treatment,
(b) slag treatment,
(c) gas injection, with one or more of oxygen, water, hydrogen or argon;
(d) directional solidification, and
(e) employing the washed silicon crystals as feedstock for a silane/Siemen's gas process.

54. A method for purifying silicon, the method comprising:
(a) forming a first molten liquid from source silicon and aluminum
(b) contacting the first molten liquid with a first gas, to provide dross and a second molten liquid;
(c) separating the dross and the second molten liquid;
(d) cooling the second molten liquid to form first silicon crystals and a first mother liquor;
(e) separating the first silicon crystals and the first mother liquor;
(f) optionally melting the first silicon crystals with a solvent metal and repeating steps (a)-(e);
(g) contacting the first silicon crystals with an acid, base, alcohol or chemical capable of dissolving the solvent metal, to provide washed silicon crystals and used acid; and
(h) separating the washed silicon crystals and the used acid, sufficient to provide purified silicon crystals;
(i) melting the purified silicon crystals, sufficient to provide a silicon melt;
(j) contacting the silicon melt with a second gas; and
(k) directionally solidifying the silicon melt.

55. The method of embodiment 54, wherein an ingot is produced.
56. The method of embodiment 55, further comprising removing the top of the ingot.
57. The method of embodiment 56, wherein removing comprising pouring off the top of a partially molten ingot.
58. The method of embodiment 55, further comprising directionally solidifying the ingot or boule sufficient to form a multicrystalline ingot or monocrystalline boule.
59. The method of embodiment 54, wherein the second gas comprises oxygen or a mix of oxygen and an inert gas.
60. The method of embodiment 54, wherein the first gas comprises chlorine or a mix of chlorine and an inert gas.
61. The method of embodiment 1, further comprising filtering the second molten liquid.
62. The method of embodiment 54, further comprising filtering the silicon melt.

Methods of the Invention

Each of the methods described herein can be carried out by any of the applicable techniques known to those of skill in the art of chemistry, metallurgy and materials science.

All publications, patents, and patent applications are incorporated herein by reference. While in the foregoing specification this invention has been described in relation to certain preferred embodiments thereof, and many details have been set forth for purposes of illustration, it will be apparent to those skilled in the art that the invention is susceptible to additional embodiments and that certain of the details described herein may be varied considerably without departing from the basic principles of the invention.

The invention claimed is:

1. A method for purifying metallurgical grade silicon with a phosphorous level below 60 ppmw and boron level below 15 ppmw, the method comprising:
(a) forming a first molten liquid from a source silicon and a solvent metal selected from the group of copper, tin, zinc, antimony, silver, bismuth, aluminum, cadmium, gallium, indium, magnesium, lead, an alloy thereof, and combinations thereof;

(b) contacting the first molten liquid with a first gas, such that a vortex is formed in the melt, to provide dross and a second molten liquid, wherein the first gas is selected from the group consisting of oxygen ($O_2$), nitrogen ($N_2$), helium (He), argon (Ar), hydrogen ($H_2$), sulfur hexafluoride ($SF_6$), water vapor ($H_2O$), oxygen ($O_2$), carbon dioxide ($CO_2$), carbon monoxide (CO), tetrafluorosilane (SiF4), and combinations thereof;

wherein the contacting the first molten liquid with the first gas employs a gas rotary degasser, thereby creating a vortex of the second molten liquid, which effectively mixes the dross in the second molten liquid;

(c) separating the dross and the second molten liquid;

(d) cooling the second molten liquid to form first silicon crystals and a first mother liquor;

(e) separating the first silicon crystals and the first mother liquor;

(f) contacting the first silicon crystals with an acid to provide washed silicon crystals and used acid; and (g) separating the washed silicon crystals and the used acid; wherein the washed silicon crystals have a boron level below 3 ppmw and a phosphorous level below 9 ppmw.

2. The method of claim 1, further comprising before forming a first molten liquid, pre-treating source silicon by slagging, gas injection, plasma torch, vacuum treatment, or a combination thereof.

3. The method of claim 1, wherein in step (a), the first molten liquid is formed by heating above the liquidus temperature.

4. The method of claim 1, wherein in step (a), metallurgical grade silicon is employed that includes about 5 ppm wt % to about 15 ppm wt % boron and about 30 ppm wt % to about 60 ppm wt % phosphorous.

5. The method of claim 1, wherein in step (a), silicon is employed in about 20 wt. % to about 60 wt. %.

6. The method of claim 1, wherein in step (a), aluminum, or an alloy thereof, is employed as the solvent metal, in about 40 wt. % to about 80 wt. %.

7. The method of claim 1, wherein after step (a) and before step (b), the first molten liquid is cooled to above the liquidus temperature.

8. The method of claim 1, wherein in step (d), the second molten liquid is cooled to above the solidus temperature and below the liquidus temperature.

9. The method of claim 1, wherein the washed silicon crystals includes less than about 4 ppmw phosphorous (P) and less than about 2 ppmw boron (B).

10. A method for purifying metallurgical grade silicon with a phosphorous level below 60 ppmw and boron level below 15 ppmw, the method comprising:

(a) forming a first molten liquid from source silicon and aluminum;

(b) contacting the first molten liquid with a first gas, such that a vortex is formed in the melt, to provide dross and a second molten liquid, wherein the first gas is selected from the group consisting of oxygen ($O_2$), nitrogen ($N_2$), helium (He), argon (Ar), hydrogen ($H_2$), sulfur hexafluoride ($SF_6$), water vapor ($H_2O$), oxygen ($O_2$), carbon dioxide ($CO_2$), carbon monoxide (CO), tetrafluorosilane (SiF4), and combinations thereof;

wherein the contacting the first molten liquid with the first gas employs a gas rotary degasser, thereby creating a vortex of the second molten liquid, which effectively mixes the dross in the second molten liquid;

(c) separating the dross and the second molten liquid;

(d) cooling the second molten liquid to form first silicon crystals and a first mother liquor;

(e) separating the first silicon crystals and the first mother liquor;

(f) optionally melting the first silicon crystals with a solvent metal and repeating steps (a)-(e);

(g) contacting the first silicon crystals with an acid, to provide washed silicon crystals and used acid; and (h) separating the washed silicon crystals and the used acid, to provide purified silicon crystals;

(i) melting the purified silicon crystals, to provide a silicon melt;

(j) contacting the silicon melt with a second gas; and (k) directionally solidifying the silicon melt; wherein the washed silicon crystals have a boron level below 3 ppmw and a phosphorous level below 9 ppmw.

11. The method of claim 10, wherein an ingot or boule is produced.

12. The method of claim 11, further comprising removing the top of the ingot.

13. The method of claim 11, further comprising directionally solidifying the ingot or boule to form a multicrystalline ingot or monocrystalline boule.

14. The method of claim 1 or 10, wherein the washed silicon crystals have a boron level below 2 ppmw, and a phosphorous level below 4 ppmw.

15. The method of claim 1 or 10, wherein the first gas comprises at least one of helium (He), Neon (Ne), Argon (Ar) and nitrogen ($N_2$).

16. The method of claim 1 or 10, wherein the first gas comprises bubbles of about 1 mm to about 5 mm.

17. The method of claim 1 or 10, wherein the acid is hydrochloric (HCl).

18. The method of claim 1 or 10, wherein at least about 240 kg of purified silicon crystals is obtained.

19. The method of claim 1 or 10, wherein the first gas is selected from the group consisting of oxygen ($O_2$), nitrogen ($N_2$), helium (He), argon (Ar), hydrogen ($H_2$), water vapor ($H_2O$), carbon dioxide ($CO_2$), carbon monoxide (CO), and combinations thereof.

* * * * *

UNITED STATES PATENT AND TRADEMARK OFFICE
CERTIFICATE OF CORRECTION

PATENT NO. : 8,480,991 B2  
APPLICATION NO. : 12/670263  
DATED : July 9, 2013  
INVENTOR(S) : Nichol et al.

Page 1 of 3

It is certified that error appears in the above-identified patent and that said Letters Patent is hereby corrected as shown below:

On the title page, in column 1, under "(75) Inventors", line 1, delete "Toronto" and insert --Toronto, ON--, therefor On the title page, in column 1, under "(75) Inventors", line 2, delete "Mississauga" and insert --Mississauga, ON--, therefor On the title page, in column 1, under "(73) Assignee", line 1, delete "Silicor Materials Inc., Palo Alto" and insert --6N Silicon Inc., Vaughan, ON--, therefor On the title page, in column 2, under "Other Publications", line 1, delete "silicon"" and insert --silicon",--, therefor On the title page, in column 2, under "Other Publications", line 2, delete "Scence" and insert --Science--, therefor On title page 2, in column 2, under "Other Publications", line 15, delete "Mailed" and insert --mailed--, therefor In the Specification In column 1, line 55, delete "liquid;" and insert --liquor;--, therefor In column 1, line 56, delete "liquid;" and insert --liquor;--, therefor In column 1, line 67, after "liquor;", delete "¶", therefor In column 2, line 33, delete "ingots" and insert --ingots.--, therefor Signed and Sealed this  
Twenty-sixth Day of August, 2014

Michelle K. Lee  
*Deputy Director of the United States Patent and Trademark Office*

CERTIFICATE OF CORRECTION (continued)
U.S. Pat. No. 8,480,991 B2

In column 3, line 61, delete "skill" and insert --skilled--, therefor

In column 6, line 26, delete "silicon" and insert --silicon.--, therefor

In column 6, line 41, delete "completion" and insert --completion.--, therefor

In column 6, line 48, delete "etc)" and insert --etc.)--, therefor

In column 7, line 4, delete "ppmwt." and insert --ppm wt.--, therefor

In column 8, line 4, delete "ppmwt." and insert --ppm wt.--, therefor

In column 8, line 5, delete "ppmwt." and insert --ppm wt.--, therefor

In column 8, line 9, delete "ppmwt" and insert --ppm wt.--, therefor

In column 8, line 9, delete "ppmwt" and insert --ppm wt.--, therefor

In column 8, line 9, delete "ppmwt" and insert --ppm wt.--, therefor

In column 8, line 10, delete "ppmwt" and insert --ppm wt.--, therefor

In column 8, line 20, delete "thereof" and insert --thereof.--, therefor

In column 8, line 40, delete "$CaCl_2$" and insert --$CaCl_2$,--, therefor

In column 8, line 55, delete "$CCl_4$," and insert --($CCl_4$),--, therefor

In column 8, line 57, delete "(SiF4)" and insert --($SiF_4$)--, therefor

In column 10, line 32, delete "liquid" and insert --liquor--, therefor

In column 11, line 36, delete "any" and insert --and--, therefor

In column 11, line 48, delete "liquid" and insert --liquor--, therefor

In column 13, line 22, delete "liquid" and insert --liquor--, therefor

In column 13, line 24, delete "liquid." and insert --liquor.--, therefor

In column 16, line 61, delete "thee" and insert --1st--, therefor

In column 18, line 7, delete "liquid" and insert --liquor--, therefor

In column 18, line 54, delete "argon;" and insert --argon,--, therefor

CERTIFICATE OF CORRECTION (continued)
U.S. Pat. No. 8,480,991 B2

In column 19, line 2, delete "liquid;" and insert --liquor;--, therefor

In column 19, line 4, delete "liquid;" and insert --liquor;--, therefor

In column 19, line 24, delete "liquid" and insert --liquor--, therefor

In column 20, line 4, delete "argon;" and insert --argon,--, therefor

In column 20, line 10, delete "aluminum" and insert --aluminum;--, therefor

In column 20, line 22, after "acid;", delete "and", therefor

In column 20, line 48, delete "skill" and insert --skilled--, therefor

In the Claims

In column 21, line 8, in Claim 1, delete "(SiF4)," and insert --(SiF$_4$),--, therefor In column 22, line 6, in Claim 10, delete "(SiF4)," and insert --(SiF$_4$),--, therefor In column 22, line 20, in Claim 10, after "acid;", delete "and", therefor In column 22, line 26, in Claim 10, after "melt;", insert --¶--, therefor